(12) United States Patent
Chaudhuri et al.

(10) Patent No.: US 8,578,086 B2
(45) Date of Patent: Nov. 5, 2013

(54) MEMORY LINK INITIALIZATION

(75) Inventors: Santanu Chaudhuri, Mountain View, CA (US); Klaus Ruff, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 673 days.

(21) Appl. No.: 12/567,585

(22) Filed: Sep. 25, 2009

(65) Prior Publication Data
US 2011/0078370 A1 Mar. 31, 2011

(51) Int. Cl.
*G06F 12/00* (2006.01)

(52) U.S. Cl.
USPC ............ 711/105; 711/100; 711/154; 711/155

(58) Field of Classification Search
None
See application file for complete search history.

(56) References Cited

U.S. PATENT DOCUMENTS

| | | | |
|---|---|---|---|
| 7,647,467 B1 * | 1/2010 | Hutsell et al. ................. | 711/170 |
| 2004/0123207 A1 | 6/2004 | Zumkehr et al. | |
| 2005/0240744 A1 * | 10/2005 | Shaikh et al. ................. | 711/167 |
| 2007/0008791 A1 | 1/2007 | Butt et al. | |
| 2008/0219064 A1 | 9/2008 | Yoon | |
| 2008/0225603 A1 | 9/2008 | Hein | |
| 2009/0322770 A1 * | 12/2009 | Bae ............................... | 345/522 |

OTHER PUBLICATIONS

Combined Search and Examination Report for United Kingdom Patent Application No. GB1015450.8 mailed Sep. 26, 2011, 6 pgs.
First Office Action for German Patent Application No. 102010044867.2-53 mailed Aug. 8, 2011, 9 pgs.

* cited by examiner

*Primary Examiner* — Kevin Verbrugge
*Assistant Examiner* — Arvind Talukdar
(74) *Attorney, Agent, or Firm* — Blakely, Sokoloff, Taylor & Zafman LLP

(57) ABSTRACT

Link initialization techniques to decouple the read training from the write training. Read training may be accomplished in a robust manner before write training is performed. These techniques may provide significantly improved link initialization times. A user-programmable register within a dynamic random access memory (DRAM) module may be utilized by the decoupled read training and write training processes. The decoupling may result in shorter and more robust training segments that may support faster training and/or increased link speeds.

19 Claims, 5 Drawing Sheets

MEMORY LINK INITIALIZATION

TECHNICAL FIELD

Embodiments of the invention relate to initialization of a link with a memory device. More particularly, embodiments of the invention relate to techniques for initialization of a double data rate (DDR) link that may provide adaptive equalization, optimized reference voltage and strobe alignment.

BACKGROUND

Current initialization procedures for DDR links generally suffer from a "chicken-and-egg" problem in that a pattern is written to memory and then read back from the memory. However, the writing process may be in error, which provides an incorrect result for a read operation. Because the error may be the result of a write operation or a read operation, an iterative and often relatively time consuming initiation process is often used, with algorithms needing sophistication and larger volume of data to isolate the cause of the errors. This results in system inefficiencies and extended training times.

FIG. 1 is a flow diagram of conventional initialization of a DDR link. In response to a reset condition, 100, a self-calibration process is initiated, 110. Command, Control and Clock signal timing is determined, 120. Write leveling operations are performed, 130. Read leveling operations are performed, 140.

Read training, 150, and write training, 160, are performed. The read and write training is an iterative process in which values are written to memory and read from memory to determine whether the read and write operations are error-free. Errors may occur, for example, from cross-talk cause by line bundling and/or interleaving of signal lines. The iterative read and write training is the result of the chicken-and-egg condition discussed above. Upon completion of the read and write training, post-training read and write operations may be performed, 170.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

The initialization techniques described herein function to decouple the read training from the write training. In one embodiment, the read training may be accomplished in a robust manner before write training is performed. These techniques may provide significantly improved link initialization times. In one embodiment, a user-programmable register within a dynamic random access memory (DRAM) module is utilized by the decoupled read training and write training processes. The decoupling may result in shorter and more robust training segments that may support faster training and/or increased link speeds.

In one embodiment, a multi-purpose register (MPR) in a DRAM module is used to store test pattern. The MPR may be a single register (e.g., a 24-bit register) or a combination of registers (e.g., three 8-bit registers). The test pattern may be of any size (e.g., 8-bit, 24-bit, 48-bit). In one embodiment, the contents of the MPR(s) may be programmed (e.g., by a sideband JTAG/SMBus) with a user-selected value. A memory controller may also include an output pin to control the reference voltage input value too the DRAM module.

Using the techniques and processes described herein, a training procedure may be provided that utilizes the MPR(s) and the reference voltage value to provide an efficient read training with memory controller reference voltage optimization, equalization adaptation in memory controller for read operation and read strobe alignment. Subsequent to completion of read training, a write training may be performed with DRAM reference voltage optimization and write strobe alignment.

Currently, training processes are accomplished by an iterative read and write training process. The read training is done by writing a pattern to the DRAM and reading it back. This causes significant lengthening of the training process and may introduce confusion as to whether any observed error has occurred during the write process or during the read process. Further, these current training processes do not include equalization optimization, memory controller reference voltage optimization and/or DRAM reference voltage optimization.

Figure 1:
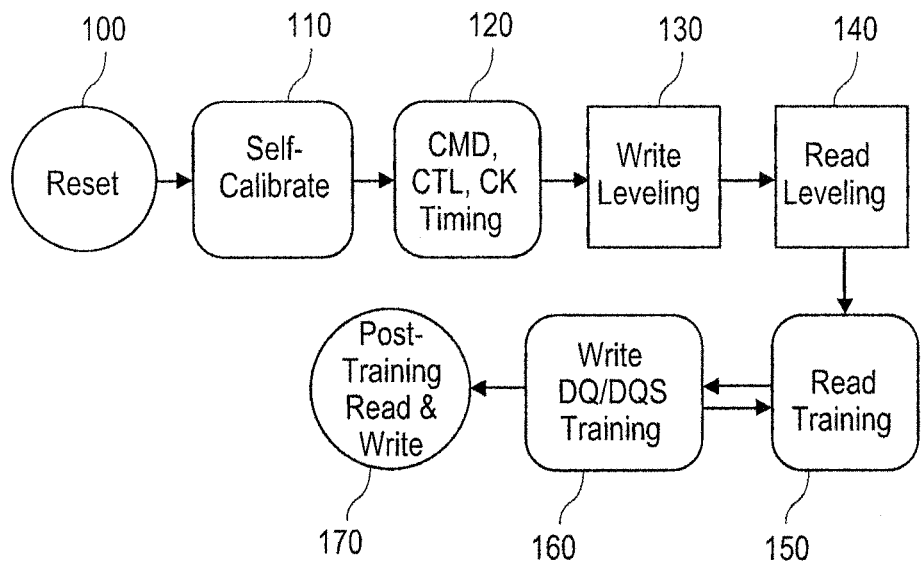
FIG. 1 is a flow diagram of conventional initialization of a DDR link.

In contrast to the iterative training processes of FIG. 1, the processes described herein are based on decoupled read and write training. In one embodiment, the memory controller receiver circuit includes receive equalizer that may be, for example, a one or two tap decision feedback equalizer (DFE). The memory controller may also include a pin for controlling the reference voltage of the DRAM. These components, along with the MPR(s) may support a procedure to adapt receive equalization, reference voltage optimization and strobe alignment in a substantially simultaneous manner.

Figure 2:
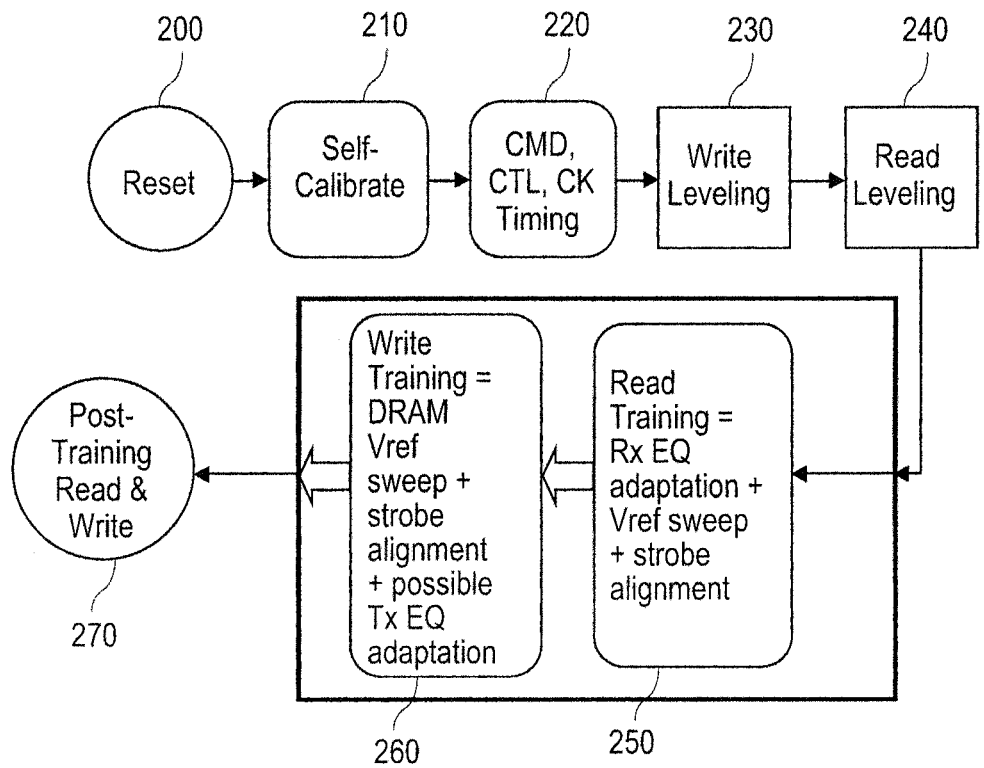
FIG. 2 is a flow diagram of one embodiment of link initialization process where the read training and write training are decoupled.

FIG. 2 is a flow diagram of one embodiment of link initialization process where the read training and write training are decoupled. Decoupling of the read training and write training during link initialization may be accomplished utilizing user-programmable MPR(s) and a pattern that can be continuously read during the read training. The write training is completed after the read training so that the write training can be accomplished using the read training pattern.

In response to a reset condition, 200, a self-calibration process is initiated, 210. The self-calibration process of FIG. 2 is different than the self-calibration process of FIG. 1 because the values used for read and write training are provided for self-calibration process, 210. Command, Control and Clock signal timing is determined, 220. Write leveling operations are performed, 230. Read leveling operations are performed, 240.

Read training is performed, 250. One embodiment of read training is described in greater detail below with respect to FIG. 3. In one embodiment, read training provided as a check to determine whether the memory has stored and provided the correct value utilizing the MPR(s) discussed above. Read training may also include one or more of: receiver equalization adaptation, reference voltage calibration and/or strobe alignment.

In one embodiment, read training is accomplished by sending data from the DRAM MPR(s) to the memory controller. The pattern length can be any length. In one embodiment, 24-bit patterns are used. The received pattern is compared to the expected pattern to determine whether a read error has occurred. During the read training process a receive side equalizer in the memory controller may be configured to compensate for frequency-dependent losses over the link being initialized. In one embodiment, this may be accomplished by utilization of an amplifier providing the inverse characteristics of the link loss.

A reference voltage sweep may be performed utilizing the pin described above. In one embodiment, strobe alignment may also be performed during read training. The decoupled read and write training process described herein allows strobe alignment to be performed more efficiently, resulting in a shorter link initialization process. This may result in a more efficient training procedure and therefore a shorter link initialization process.

Write training is performed, 260. One embodiment of write training is described in greater detail below with respect to FIG. 4. In one embodiment, write training provided a check to determine whether the memory has stored the correct value utilizing the MPR(s) discussed above. That is, because read training has been completed, read operations can be considered functional and operating correctly. Therefore, writes to the MPR(s) can be utilized to determine whether write errors occur without the possibility of the error being the result of a read error as in the procedure of FIG. 1. Write training may also include one or more of: transmitter equalization adaptation, reference voltage calibration and/or strobe alignment.

In one embodiment, write training is accomplished by sending data from the memory controller to the DRAM MPR (s). The pattern length can be any length. In one embodiment, 24-bit patterns are used. The received pattern is compared to the expected pattern to determine whether a write error has occurred. During the write training process a transmit equalizer in the memory controller may be configured to compensate for frequency-dependent losses over the link being initialized. In one embodiment, this may be accomplished by utilization of an amplifier providing the inverse characteristics of the link loss.

A reference voltage sweep may be performed utilizing the pin described above. In one embodiment, strobe alignment may also be performed during write training. Upon completion of the read and write training, post-training read and write operations may be performed, 270.

Figure 3:
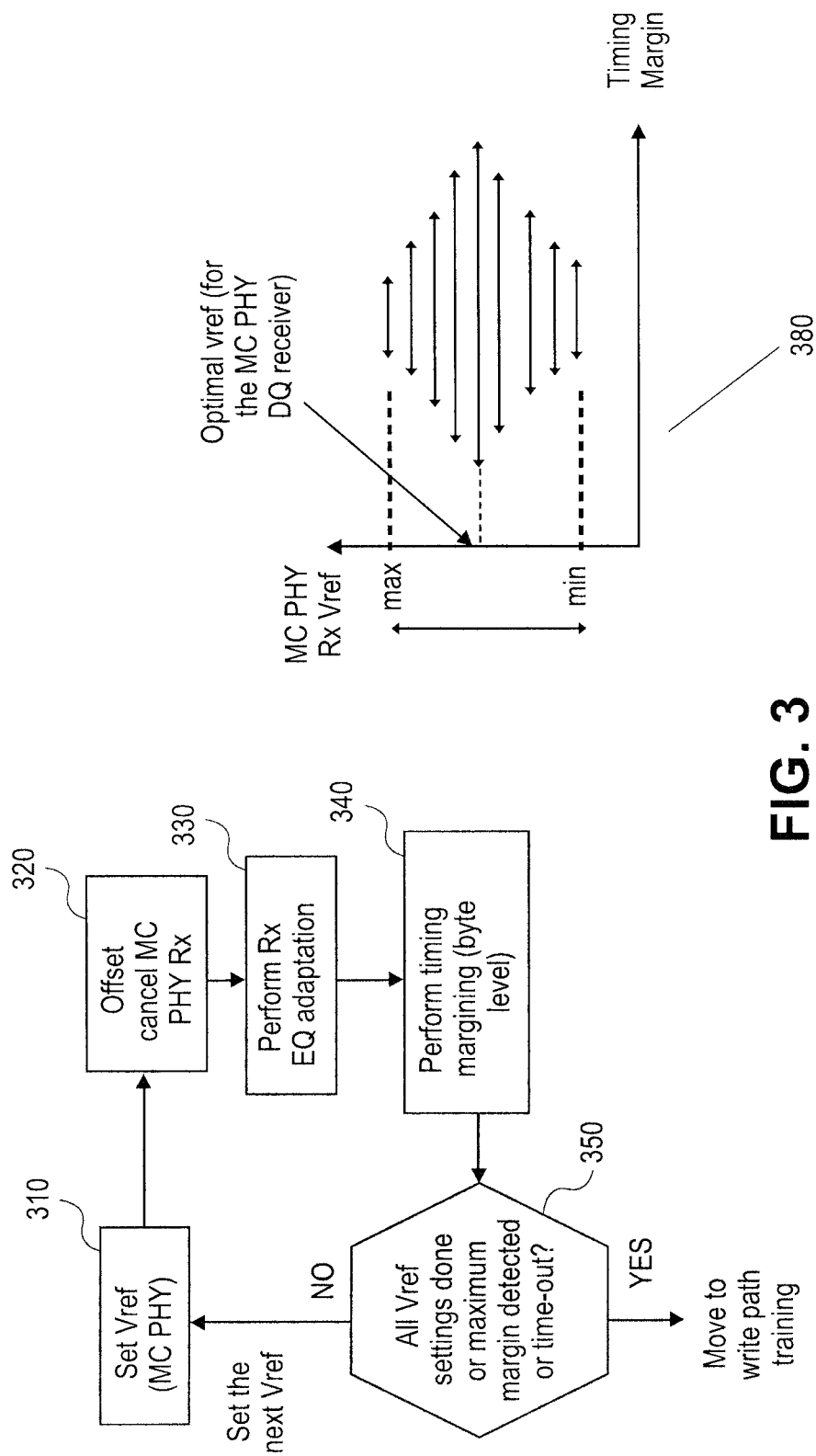
FIG. 3 is a conceptual illustration of one embodiment of a read training procedure.

FIG. 3 is a conceptual illustration of one embodiment of a read training procedure. In one embodiment, for all incoming data for read training the MPR(s) are used to send patterns to the memory controller. Any pattern length may be used (e.g., 24 bits, 16 bits, 48 bits) and may be the length of one MPR or multiple MPRs. In one embodiment, it is expected that the optimum reference voltage will change during training for a randomized patter, so the reference voltage to be swept, for random pattern based optimization is set after training to save processor time.

In one embodiment, the process of FIG. 3 is initiated with a default value for the reference voltage, 310, at the memory controller transmitter and a default value for the receiver equalizer.

In one embodiment, the reference voltage is swept from a minimum value to a maximum value and, for each value, the receive equalizer is optimized, 330, and the timing margin is measured, 340, using strobe sweeping in the memory controller. These procedures are performed for all reference voltage settings, detection of a maximum margin, or a time-out condition, 350. In one embodiment, the optimized reference voltage value is the one corresponding to the maximum timing margin, 380. In one embodiment, the range for the reference voltage sweep, the granularity of the sweep and the number of intervals for which equalizer optimization is performed, are user controlled.

The receiver equalizer can be, for example, a one or two (or more) tap DFE, depending on the link employed. DFEs may allow faster equalizer optimization than use of a CTLE and may also cancel reflections, which may be dominant in memory lines.

Figure 4:
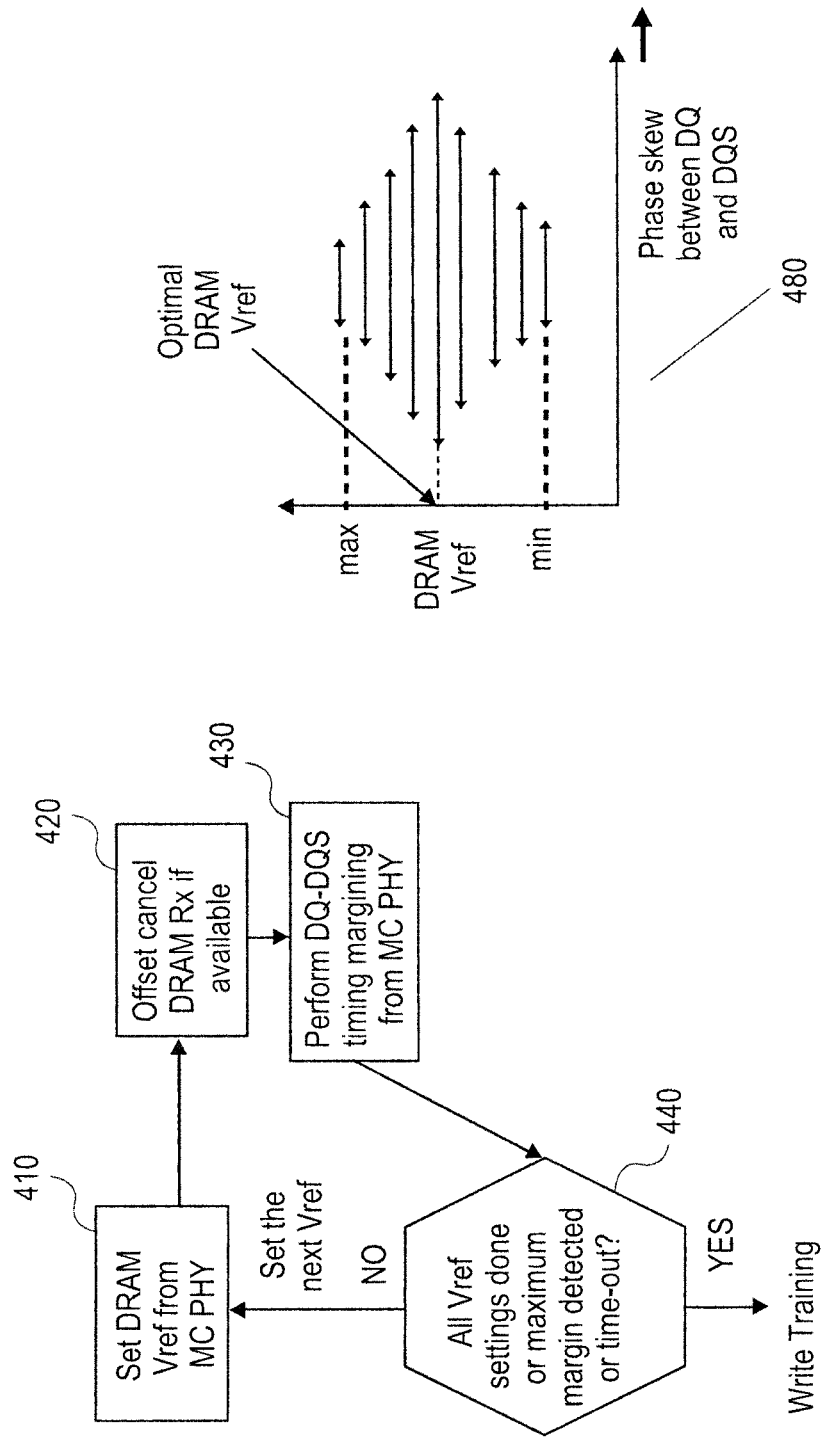
FIG. 4 is a conceptual illustration of one embodiment of a write training procedure.

FIG. 4 is a conceptual illustration of one embodiment of a write training procedure. In one embodiment, the DRAM reference voltage is set by the memory controller, 410, using the programmable pin discussed above and may be swept from a minimum to a maximum that may be user defined, 480. For each reference voltage setting, the transmitted data-data strobe phase may be swept and the written and read bits compared to the bits that were sent form memory controller pattern buffer, 430.

In one embodiment, the timing margin is defined by the "left" and "right" phase skew difference between the data and data strobe signals at which the bit errors exceed a pre-selected threshold. In one embodiment, the optimum DRAM reference voltage is the value at which the timing margin is the largest. The loop is started with a default value for the transmit equalizer. The default value may be determined, for example, using platform link simulations. If, based on the simulations, it is deemed that there are potential margins to be gained by transmit equalizer optimization, then the loop of FIG. 4 may be repeated for each transmit equalizer setting and the particular setting that yields the largest margin may be utilized.

Figure 5:
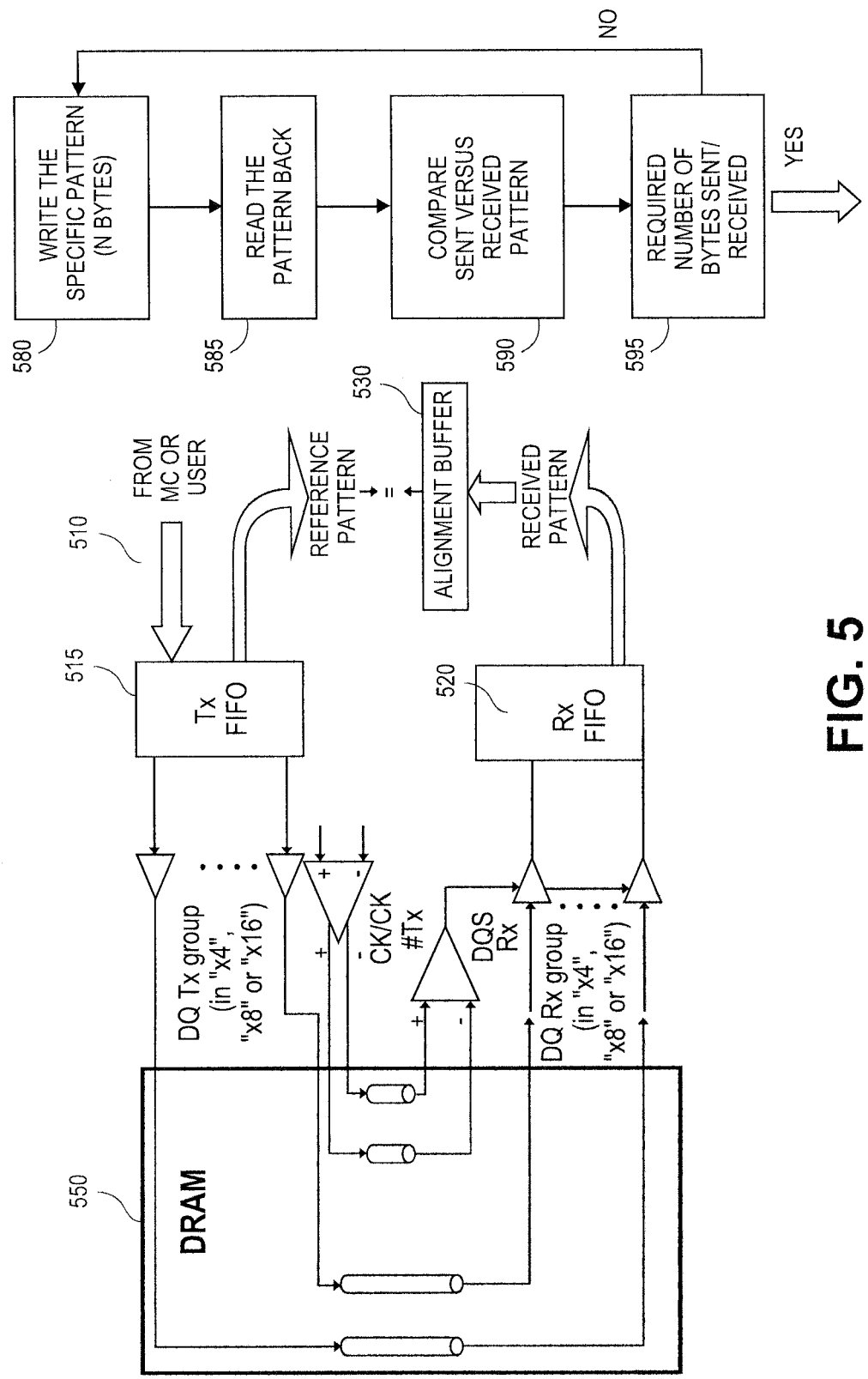
FIG. 5 is a conceptual illustration of one embodiment of an error computation in a write training procedure.

FIG. 5 is a conceptual illustration of one embodiment of an error computation in a write training procedure. The timing and margining determination for any setting, done by comparing the pattern transmitted with the pattern read, at the memory controller is conceptually illustrated in FIG. 5. For either read training or write training, the "edges" for the timing margin may be determined by the memory controller when comparing the average number of errors recorded over the number of bytes sent, as evaluated by comparing the transmitted pattern to the received pattern.

Error computation may be performed by writing a pattern to memory, 580. The pattern 510 is provided to memory 550 by a memory controller or user through transmit buffer 515. The pattern is read back from memory, 585. The pattern is received from memory 550 by the memory controller through receive buffer 520. In one embodiment, the received pattern is stored in alignment buffer 530.

The received pattern is compared to the transmitted pattern, 590. The process repeats until the required number of bytes are sent and received, 595. This comparison is the mechanism by which error computation may be accomplished in the write training procedure.

In one embodiment, the sweeping of the strobe signal, for either read training or write training, is performed by the memory controller. The following modifications may be utilized to provide a more accurate and time-efficient operation. A binary sweep may be utilized rather than a linear sweep of the timing margins over the interval and for the reference voltage range. If zero errors are recorded at a certain setting over a specified number of bytes, the strobe may be considered too far from the edge and the strobe may be moved forward before the default number of bytes are tested.

In one embodiment, the sequence of optimization utilizes a JTAG or BIOS scan or a finite state machine having hardware implements the initialization process. The components that implement the initialization and optimization may provide a set of registers to save at least two levels of previous parameter values in order to provide the comparison and at least one register that is immune to warm resets to save the final optimized values that could be reused after initialization unless a hard platform reset occurs.

Figure 6:
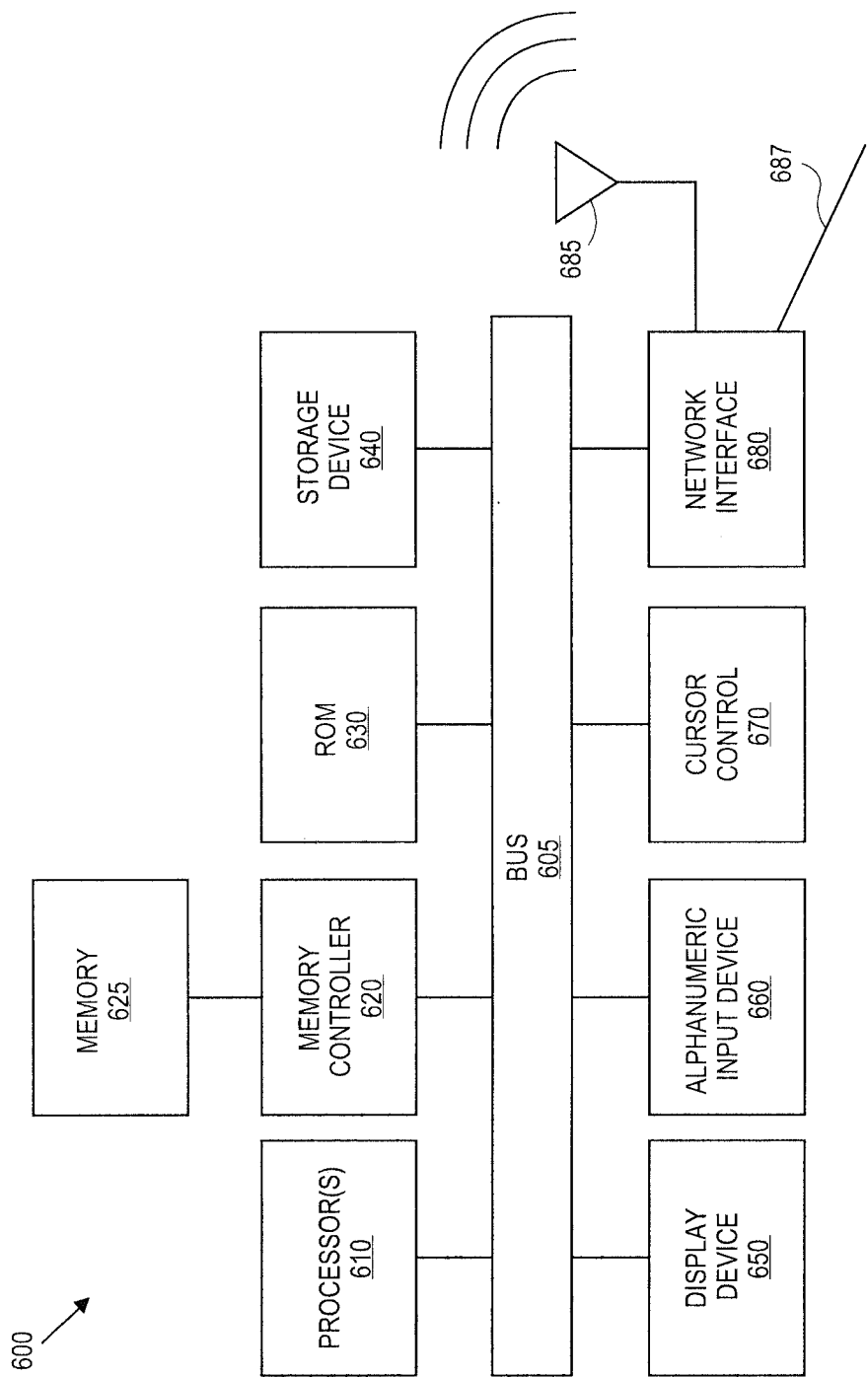
FIG. 6 is a block diagram of one embodiment of an electronic system.

FIG. 6 is a block diagram of one embodiment of an electronic system. The electronic system illustrated in FIG. 6 is intended to represent a range of electronic systems (either wired or wireless) including, for example, desktop computer systems, laptop computer systems, cellular telephones, personal digital assistants (PDAs) including cellular-enabled PDAs, set top boxes. Alternative electronic systems may include more, fewer and/or different components.

Electronic system 600 includes bus 605 or other communication device to communicate information, and processor 610 coupled to bus 605 that may process information. While electronic system 600 is illustrated with a single processor, electronic system 600 may include multiple processors and/or co-processors. Electronic system 600 further may include random access memory (RAM) or other dynamic storage device 625 (referred to as main memory), coupled to bus 605 and may store information and instructions that may be executed by processor 610. Main memory 625 may also be used to store temporary variables or other intermediate information during execution of instructions by processor 610.

In one embodiment memory controller 620 may be coupled between bus 605 and memory 625. In alternate embodiments, memory controller 620 may be included within other components of electronic system 600, for example, processor 610. Memory controller 620 generally manages the flow of data to and from memory 625. Memory controller 620 and memory 625 may include one or more multipurpose registers that may be utilized for initialization of the link between memory controller 620 and memory 625 in the manner described herein.

Instructions and/or circuitry to cause the link initialization process described herein may be stored in one or more of the components of electronic system 600. For example, instructions may be stored in firmware in memory controller 620, or in ROM 630. These instructions may cause memory controller 620 to perform the link initialization procedure described herein. In another embodiment, processor(s) 610 may be involved in the link initialization procedure.

Electronic system 600 may also include read only memory (ROM) and/or other static storage device 630 coupled to bus 605 that may store static information and instructions for processor 610. Data storage device 640 may be coupled to bus 605 to store information and instructions. Data storage device 640 such as a magnetic disk or optical disc and corresponding drive may be coupled to electronic system 600.

Electronic system 600 may also be coupled via bus 605 to display device 650, such as a cathode ray tube (CRT) or liquid crystal display (LCD), to display information to a user. Alphanumeric input device 660, including alphanumeric and other keys, may be coupled to bus 605 to communicate information and command selections to processor 610. Another type of user input device is cursor control 670, such as a mouse, a trackball, or cursor direction keys to communicate direction information and command selections to processor 610 and to control cursor movement on display 650.

Electronic system 600 further may include network interface(s) 680 to provide access to a network, such as a local area network. Network interface(s) 680 may include, for example, a wireless network interface having antenna 685, which may represent one or more antenna(e). Network interface(s) 680 may also include, for example, a wired network interface to communicate with remote devices via network cable 687, which may be, for example, an Ethernet cable, a coaxial cable, a fiber optic cable, a serial cable, or a parallel cable.

In one embodiment, network interface(s) 680 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 680 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:
1. A method comprising:
   programming data in a multi-purpose register in a memory device;
   performing a read training procedure to initialize a link between a memory controller and the memory device by transmitting the data from the multi-purpose register in the memory device to the memory controller over the link, wherein read training includes at least receiver equalization adaptation, reference voltage calibration and strobe alignment and during the read training process a receive side equalizer in the memory controller is configured to compensate for frequency-dependent losses over the link being initialized;

comparing the data from the multipurpose register as received by the memory controller with an expected result;

performing a write training procedure over the link upon completion of the read training procedure, wherein the write training procedure includes transmitting the received data from the memory controller to the memory device, wherein write training includes at least transmitter equalization adaptation, reference voltage calibration and strobe alignment; and comparing the data received from the memory controller to the data stored in the multi-purpose register.

2. The method of claim 1 wherein the read training procedure further comprises adjusting a receive equalizer in the memory controller to compensate for frequency-dependent losses over the link.

3. The method of claim 1 wherein the read training procedure further comprises performing strobe alignment for a data strobe associated with reading data from the memory device.

4. The method of claim 1 wherein the read training procedure further comprises performing a reference voltage sweep to select a reference voltage for use in by the memory controller receiver.

5. The method of claim 1 wherein the write training procedure further comprises adjusting a transmit equalizer in the memory controller to compensate for frequency-dependent losses over the link.

6. The method of claim 1 wherein the write training procedure further comprises performing strobe alignment for a data strobe associated with writing data to the memory device.

7. The method of claim 1 wherein the write training procedure further comprises performing a reference voltage sweep to select a reference voltage for use in by the memory controller transmitter.

8. A system comprising:
a memory device having at least one multipurpose register and an addressable memory array to store data, the memory device having an interface, the multipurpose register to be programmed with a known data pattern prior to link initialization;
a physical link coupled with the memory device interface; and
a memory controller having transmit and receive circuitry coupled with an interface coupled with the physical link and memory control circuitry to performing a read training procedure to initialize the link by receiving data from the multipurpose register in the memory device to the memory controller over the link and comparing the data from the multipurpose register with an expected result, wherein read training includes at least receiver equalization adaptation, reference voltage calibration and strobe alignment and during the read training process a receive side equalizer in the memory controller is configured to compensate for frequency-dependent losses over the link being initialized, the memory controller further to perform a write training procedure upon completion of the read training procedure, the write training procedure including transmitting the received data from the memory controller to the memory device, wherein write training includes at least transmitter equalization adaptation, reference voltage calibration and strobe alignment;
the memory device to compare the data received from the memory controller to the data stored in the multipurpose register.

9. The system of claim 8 wherein the memory controller further comprises a receiver equalizer and the read training procedure further comprises adjusting a receiver equalizer to compensate for frequency-dependent losses over the link.

10. The system of claim 8 wherein the read training procedure further comprises performing strobe alignment for a data strobe associated with reading data from the memory device.

11. The system of claim 8 wherein the read training procedure further comprises performing a reference voltage sweep to select a reference voltage for use in by a memory controller receiver.

12. The system of claim 8 wherein the memory controller further comprises a transmitter equalizer and the write training procedure further comprises adjusting the transmit equalizer to compensate for frequency-dependent losses over the link.

13. The system of claim 8 wherein the write training procedure further comprises performing strobe alignment for a data strobe associated with writing data to the memory device.

14. The system of claim 8 wherein the write training procedure further comprises performing a reference voltage sweep to select a reference voltage for use in by the memory controller transmitter.

15. A non-volatile memory device having stored thereon instructions that, when executed by one or more electronic components, cause a memory controller and a memory device to:
program data in a multi-purpose register in a memory device;
perform a read training procedure to initialize a link between a memory controller and the memory device by transmitting the data from the multi-purpose register in the memory device to the memory controller over the link, wherein read training includes at least receiver equalization adaptation, reference voltage calibration and strobe alignment and during the read training process a receive side equalizer in the memory controller is configured to compensate for frequency-dependent losses over the link being initialized;
compare the data from the multipurpose register as received by the memory controller with an expected result;
perform a write training procedure over the link upon completion of the read training procedure, wherein the write training procedure includes transmitting the received data from the memory controller to the memory device, wherein write training includes at least transmitter equalization adaptation, reference voltage calibration and strobe alignment; and
compare the data received from the memory controller to the data stored in the multi-purpose register.

16. The memory of claim 15 wherein the read training procedure further comprises performing strobe alignment for a data strobe associated with reading data from the memory device.

17. The memory of claim 15 wherein the read training procedure further comprises performing a reference voltage sweep to select a reference voltage for use in by the memory controller receiver.

18. The memory of claim 15 wherein the write training procedure further comprises performing strobe alignment for a data strobe associated with writing data to the memory device.

19. The memory of claim 15 wherein the write training procedure further comprises performing a reference voltage sweep to select a reference voltage for use by the memory controller transmitter.

* * * * *